United States Patent [19]
Ooishi

[11] Patent Number: 5,723,885
[45] Date of Patent: Mar. 3, 1998

[54] SEMICONDUCTOR DEVICE INCLUDING A FERROELECTRIC FILM AND CONTROL METHOD THEREOF

[75] Inventor: Tsukasa Ooishi, Hyogo, Japan

[73] Assignee: Mitsubishi Denki Kabushiki Kaisha, Tokyo, Japan

[21] Appl. No.: 614,578

[22] Filed: Mar. 13, 1996

[30] Foreign Application Priority Data

Jun. 8, 1995 [JP] Japan .................................. 7-142280

[51] Int. Cl.$^6$ .......................... H01L 29/76; H01L 29/94; H01L 31/062; H01L 31/113
[52] U.S. Cl. ...................... 257/295; 257/401; 257/410; 257/411; 365/65; 365/104; 365/117; 365/145; 365/177; 365/184
[58] Field of Search ......................... 257/295, 410, 257/411, 401; 365/117, 65, 145, 177, 184, 104

[56] References Cited

U.S. PATENT DOCUMENTS

| | | | |
|---|---|---|---|
| 2,791,760 | 5/1957 | Ross | 257/295 X |
| 5,515,311 | 5/1996 | Mihara | 365/145 |
| 5,554,866 | 9/1996 | Nishioka et al. | 257/295 |
| 5,612,574 | 3/1997 | Summerfelt et al. | 257/295 X |

FOREIGN PATENT DOCUMENTS

| | | | |
|---|---|---|---|
| 4-256361 | 9/1992 | Japan . | |
| 5-114732 | 5/1993 | Japan . | |
| 6-76562 | 3/1994 | Japan . | |
| 6-151869 | 5/1994 | Japan | 257/295 |
| 6-504409 | 5/1994 | Japan . | |
| 6-163914 | 6/1994 | Japan | 257/295 |

Primary Examiner—William Mintel
Attorney, Agent, or Firm—Lowe, Price, LeBlanc & Becker

[57] ABSTRACT

A non-volatile semiconductor device can be obtained which is capable of enhancing integration level and performing accurate control of operations. A memory cell transistor of the semiconductor device in accordance with the present invention has a gate dielectric film including a ferroelectric film between a gate electrode and a semiconductor region. A back electrode is formed at the semiconductor region in a position corresponding to the gate electrode. A channel is formed at a channel formation region of the semiconductor region by applying a voltage to the back electrode, and the ferroelectric film is polarized as desired by the difference in potential between the channel and the gate electrode. Information can thus be written into the memory cell.

10 Claims, 10 Drawing Sheets

|  | OUTPUT A B C | BIT FORMAT OF DATA |
|---|---|---|
| "L" | 0 0 0 | 0 0 |
| "INTER-MEDIATE L" | 0 0 1 | 0 1 |
| "INTER-MEDIATE H" | 0 1 1 | 1 0 |
| "H" | 1 1 1 | 1 1 |

SEMICONDUCTOR DEVICE INCLUDING A FERROELECTRIC FILM AND CONTROL METHOD THEREOF

BACKGROUND OF THE INVENTION

1. Field of the Invention

The present invention relates to semiconductor devices including a ferroelectric film and control methods thereof, and more particularly, to a semiconductor device including a memory cell for storing information by using a ferroelectric film and a method of controlling reading/writing of information by using such a semiconductor device.

2. Description of the Background Art

Figure 14:
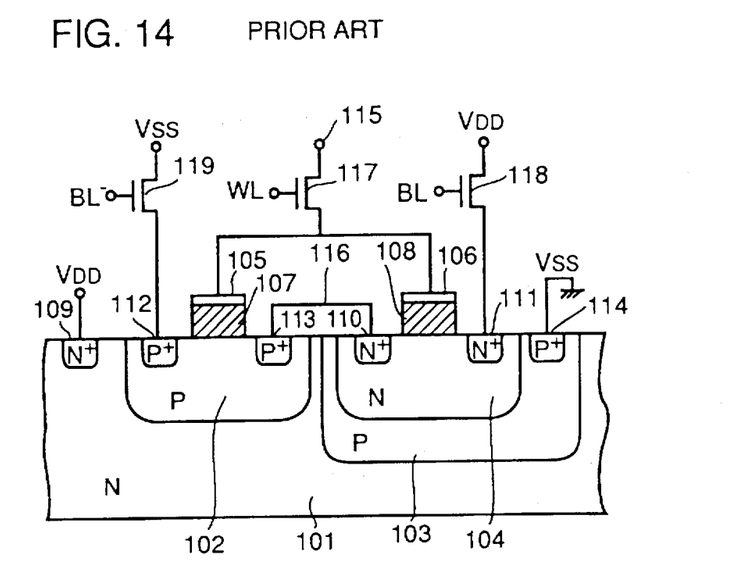
FIG. 14 is a cross sectional view showing a conventional semiconductor device.

FIG. 14 is a cross sectional view showing a memory cell in a conventional semiconductor device described in Japanese Patent Laying-Open No. 4-256361. Referring to FIG. 14, at a main surface of a semiconductor substrate 101 including n type impurity, p well regions 102 and 103 are formed with a prescribed distance therebetween. An n well region 104 is formed at a main surface of p well region 103. At a main surface of p well region 102, p type high concentration impurity regions 112 and 113 are formed with a prescribed distance therebetween. A p type high concentration impurity region 114 is formed at a main surface of p well region 103 in a region where n well region 104 is not formed. At a main surface of n well region 104, n type high concentration impurity regions 110 and 111 are formed with a prescribed distance therebetween. An n type high concentration impurity region 109 is formed at a prescribed region of the main surface of semiconductor substrate 101. At a region located between p type high concentration impurity regions 112 and 113 at the main surface of p well region 102, a gate electrode 105 is formed with a ferroelectric film 107 interposed therebetween. At a region located between n type high concentration impurity regions 110 and 111 at the main surface of n well region 104, a gate electrode 106 is formed with a ferroelectric film 108 interposed therebetween. Gate electrodes 105 and 106 are electrically connected with each other, and the connection portion thereof is connected to an output terminal 116 through a transistor 117. Transistor 117 has a gate electrode connected to a word line (WL). The p type high concentration impurity region 113 and n type high concentration impurity region 110 are electrically connected with each other, and the connection portion thereof is connected to an output terminal 116. The n type high concentration impurity region 111 is connected to $V_{DD}$ through a transistor 118. Transistor 118 has a gate electrode connected to a bit line (BL).

The p type high concentration impurity region 112 is connected to $V_{SS}$ through a transistor 119, which has a gate electrode connected to a complementary bit line (BL$^-$). In addition, n type high concentration impurity region 109 is connected to $V_{DD}$, while p type high concentration impurity region 114 is connected to $V_{SS}$.

Figure 15:
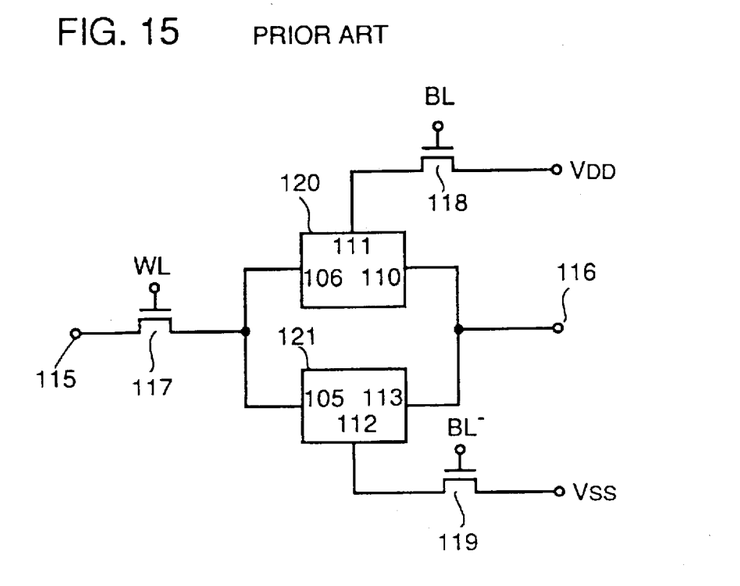
FIG. 15 is an equivalent circuit diagram of the conventional semiconductor device.

FIG. 15 is an equivalent circuit diagram of the semiconductor device shown in FIG. 14. Referring to FIG. 15, n type high concentration impurity regions 110 and 111 and gate electrode 106 form an n type resistor 120, while p type impurity regions 112 and 113 and gate electrode 105 form a p type resistor 121. A feature of the memory cell of the semiconductor device shown in FIGS. 14 and 15 lies in that ferroelectric films 107 and 108 are formed between gate electrodes 105 and 106 and the semiconductor region including the semiconductor substrate. A voltage is applied to gate electrodes 105 and 106 to polarize ferroelectric films 107 and 108, thereby storing information. In this conventional semiconductor device, the conductivity type of the impurity included in the semiconductor region is identical to that of the impurity included in the source/drain region, and the impurity concentration at the source/drain region is greater than that of the semiconductor region serving as, for example, a channel region.

Description will now be made of writing information into the conventional memory cell shown in FIG. 14. By setting the word line (WL) and a pair of bit lines (BL and BL$^-$) all to an ON signal state (BL attains an ON state when it is low, while BL$^-$ attains an ON state when it is High) to turn all of the transistors 117, 118 and 119. Thereafter, a positive voltage is applied to input terminal 115. As a result, ferroelectric films 107 and 108 are polarized, whereby negative charges are induced to the main surfaces of p well region 102 and n well region 104. In other words, a depletion layer is formed at the main surface of p well region 102. When this depletion layer contacts another depletion layer generated at a junction portion between p well region 102 and n type semiconductor substrate 101, p type resistor 121 exhibits an extremely high resistance.

Meanwhile, electrons are induced to the main surface of n well region 104, thereby reducing the resistance of n type resistor 120. Consequently, output to the output terminal 116 is high. Since the ferroelectric film remains in the polarized state even though no voltage is applied to input terminal 115, output terminal 116 remains high. More specifically, "1" is stored. Here, consider a case where a negative voltage is applied to input terminal 115 thereafter. In this case, ferroelectric films 107 and 108 are polarized so that positive charges are induced to the main surfaces of p well region 102 and n well region 104. As a result, a depletion layer is generated at the main surface of n well region 104, whereby n type resistor 120 exhibits an extremely high resistance. Meanwhile, holes are induced to the main surface of p well region 102, whereby p type resistor 121 exhibits a low resistance. Consequently, output terminal 116 attains Low. In other words, "0" is stored ("1" stored previously is erased). Since information will not be lost because of remanent polarization even after turning off the power supply, the memory cell almost permanently holds the information once stored.

Next, description will be made of data readout. For readout, word line (WL) remains in an OFF state, while the pair of bit lines (BL and BL$^-$) are set in an ON state. Consequently, "High" is output to output terminal 116 if information of "1" is written, while Low is output thereto if "0" is written.

In the semiconductor device as described above, since the memory cell stores only binary information of "0" or "1", the amount of information which can be stored therein has not been so large. Furthermore, to write information to the memory cell, the ferroelectric film formed between the gate electrode and the semiconductor substrate is polarized by the difference in potential between the gate electrode and the semiconductor substrate. Accordingly, since the potential of the semiconductor substrate is generally fixed to a predetermined value, the direction of polarization of the ferroelectric film must be controlled only by the potential of the gate electrode.

SUMMARY OF THE INVENTION

A semiconductor device according to one aspect of the present invention is provided with a memory cell including first and second semiconductor regions, a gate dielectric film, a gate electrode, and a back electrode. The first semiconductor region forms a channel region and has a first conductivity type. The second semiconductor regions form source/drain regions formed at both ends of the first semiconductor region and have a second conductivity type. The gate dielectric film is formed on one main surface of the first semiconductor region and has a ferroelectric film. The gate electrode is formed on the ferroelectric film. The back electrode is formed on another main surface of the first semiconductor region at a position opposite to the gate electrode with an insulating film interposed therebetween. In this semiconductor device, by forming the back electrode and applying a predetermined voltage to the back electrode, the first semiconductor region forming the channel region is depleted or becomes an inversion layer. Since the inversion layer is thus formed easily, the difference in potential between the channel region and the gate electrode can be adjusted more freely by adjusting respective voltages applied to the source/drain region and to the gate electrode. If the insulating film interposed between the other main surface of the first semiconductor region and the back electrode described above includes a ferroelectric film, the ferroelectric film is polarized in a direction supporting the electric field directed from the back electrode to the first semiconductor region by adjusting the difference in potential between the back electrode and the first semiconductor region. Consequently, by polarizing the ferroelectric film in the insulating film in the direction facilitating formation of the inversion layer, the potential applied to the back electrode upon writing can be made small or formation of the inversion layer can be ensured.

In the semiconductor device according to the above one aspect of the present invention, the gate electrode and the back electrode can be formed in strips to extend in the directions different from each other. Thus, a memory cell can be formed at a position where the gate electrode and the back electrode overlap, so that the memory cells can be arranged efficiently and a greater number of memory cells can be arranged in a predetermined range.

In the semiconductor device according to the above one aspect of the present invention, the gate electrode and the back electrode can be formed in strips and can be arranged to extend in the directions different from each other, and the source region and the drain region formed in one memory cell can be arranged to extend in the directions different from those of the gate electrode and the back electrode. Structured as such, the source/drain region is disposed in a position not overlapping the gate electrode or the back electrode, so that a contact can be easily formed on the source/drain region and the memory cells can be arranged efficiently, thereby enhancing integration level of the semiconductor device.

In the semiconductor device according to the above one aspect of the present invention, the gate electrodes and the back electrodes described above can be formed in strips and can be arranged to extend in the directions different from each other, and the angle, formed at a position where the gate electrode and the back electrode of the memory cell overlap by the directions in which these electrodes extend, can be substantially a right angle. Structured as such, a plurality of memory cells arranged in row and column directions form a matrix, thereby allowing efficient arrangement of the memory cells. As a result, integration level of the semiconductor device can be enhanced.

The semiconductor device according to the above-described one aspect can be formed to further include a plurality of memory cells, a plurality of first interconnections, a plurality of second interconnections, and a sense amplifier. In this case, the plurality of memory cells are arranged in row and column directions. The first interconnections connect source regions or drain regions of the plurality of memory cells. The plurality of second interconnections connect drain regions or source regions of the plurality of memory cells and arranged in a direction different from the first interconnections. The sense amplifier is connected to two adjacent interconnections of either the first or the second interconnections described above. Thus, at least one interconnection of either the plurality of the first interconnections or the second interconnections is employed as an interconnection for supplying a reference current in reading out information of the memory cell connected to the other interconnection, and two pieces of complementary information are stored in two memory cells respectively, so that the information stored in one memory cell can be used as a reference current in reading out the information stored in the other memory cell, thereby allowing accurate detection of information.

A method of controlling a semiconductor device according to another aspect of the present invention, on one main surface of a first semiconductor region of a first conductivity type forming a channel region, a gate electrode is formed with a gate dielectric film having a ferroelectric film interposed therebetween, and a prescribed voltage is applied to the gate electrode. The potentials of second semiconductor regions of a second conductivity type formed in contact with both ends of the first semiconductor region and constituting a source/drain region are set at a prescribed potential. The potential of the first semiconductor region is set equal to that of the second semiconductor region. The ferroelectric film is polarized by the difference in potential between the gate electrode and the first semiconductor region. Thus, in the method of controlling a semiconductor device, the potential of an inversion layer in a memory cell is set equal to that of the source/drain region and the ferroelectric film in the gate dielectric film is polarized by the difference in potential between the inversion layer and the gate electrode film, so that information can be stored.

In the method of controlling a semiconductor device according to the above another aspect of the present invention, in polarizing the ferroelectric film, the ferroelectric film can be structured to attain one of a plurality of polarization states. Structured as such, the differences in potential between the gate electrode and the inversion layer are classified into a plurality of levels and the direction of the electric field formed between the gate electrode and the inversion layer is changed, whereby a plurality of polarization states of the ferroelectric film can be established. Accordingly, one memory cell can store a greater amount of information.

In the method of controlling a semiconductor device according to the another aspect described above, a prescribed voltage can be applied to the gate electrode to detect the value of current flowing between the source/drain regions. Thus, the information stored in the memory cell can be detected easily.

A method of controlling a semiconductor device according to still another aspect of the present invention, an inversion layer is formed, at a first semiconductor region of a first conductivity type having one main surface and another main surface and serving as a channel region, by applying a prescribed voltage to a back electrode formed under the other main surface of the first semiconductor region with an insulating film interposed therebetween. A prescribed voltage is applied to second semiconductor regions of a second conductivity type formed in contact with both ends of the first semiconductor region and serving as source/drain regions, whereby the potential of the inversion layer is set equal to that of the source/drain region. A voltage of an arbitrary value is applied to a gate electrode formed on the one main surface of the first semiconductor region with a gate dielectric film having a ferroelectric film interposed therebetween, and the ferroelectric film in the gate dielectric film is polarized by the difference in potential between the gate electrode and the inversion layer. Thus, fine adjustment of the difference in potential between the channel and the gate electrode can be achieved accurately.

In the method of controlling a semiconductor device according to the above still another aspect of the present invention, in polarizing the ferroelectric film, the ferroelectric film can be structured to attain a plurality of polarization states, and therefore one piece, among many kinds, of information can be stored. Accordingly, more information can be held than a conventional semiconductor device having the same number of memory cells.

In the method of controlling a semiconductor device according to the above still another aspect of the present invention, the first semiconductor region may include p type impurity, and the source/drain region may include n type impurity. Furthermore, a positive voltage may be applied to the back electrode when the inversion layer is formed, and a positive or negative voltage may be applied to the gate electrode when the ferroelectric film is polarized. Thus, the inversion layer can be formed easily, so that writing information to a memory cell can be performed accurately.

In the method of controlling a semiconductor device according to the above still another aspect of the present invention, the semiconductor device may also be structured so that the first semiconductor region includes n type impurity, the source/drain region includes p type impurity, a negative voltage is applied to the back electrode in forming the inversion layer, and a negative or a positive voltage is applied to the gate electrode in polarizing the ferroelectric film. As a result, the inversion layer can be formed easily and information can be accurately written to the memory cell.

A method of controlling a semiconductor device according to a further aspect of the present invention, an inversion layer is formed, at a first semiconductor region of a first conductivity type having one main surface and another main surface of a memory cell arranged in either row or column direction among memory cells arranged in row and column directions, by selectively setting a potential of a prescribed number of a plurality of first electrode lines to a prescribed potential, which lines connect back electrodes each formed under the other main surface of the first semiconductor region, with an insulating layer interposed therebetween. Among a plurality of second electrode lines connecting gate electrodes each formed on the one main surface of the first semiconductor region of the memory cell arranged in either column or row direction with a gate dielectric film having a ferroelectric film interposed therebetween, a prescribed number of the second electrode lines are set to have a predetermined potential. A predetermined voltage is applied to second semiconductor regions of a second conductivity type formed in contact with both ends of the first semiconductor region, thereby setting the potential of the inversion layer formed at the first semiconductor region equal to that of the second semiconductor region. The ferroelectric film in the gate dielectric film of a memory cell at a position where the selected first and second electrode lines receiving a predetermined voltage overlap with each other is polarized by the difference in potential between the gate electrode and the inversion layer. Thus, in the method of controlling a semiconductor device, the electrode lines connecting the gate electrodes of a plurality of memory cells and the electrode lines connecting the back electrodes of the plurality of memory cells are selectively set to have a prescribed potential, so that the position of a memory cell at which information should be rewritten can be designated.

In the method of controlling a semiconductor device according to the above further aspect of the present invention, a plurality of the first and second electrode lines can be selected when a prescribed voltage is applied to the second electrode line and when the potential of the inversion layer is set equal to that of the second semiconductor region. Consequently, many memory cells can be designated, making it possible to entirely rewrite information in many memory cells.

In a method of controlling a semiconductor device according to still a further aspect of the present invention, two memory cells are arranged adjacent to each other in a column direction among a plurality of memory cells arranged in row and column directions, a gate dielectric film having a ferroelectric film is formed at one main surface of a first semiconductor region of a first conductivity type of each memory cell, a polarization direction of one ferroelectric film is complementary to that of the other ferroelectric film, a predetermined voltage is applied to an electrode line connecting gate electrodes and extending in the row direction and each gate electrode is formed on the first semiconductor region of a memory cell arranged in the row direction with the gate dielectric film interposed therebetween. An electric field is formed between source and drain regions of second semiconductor regions of second conductivity type formed in contact with both ends of the first semiconductor region and serving as source/drain regions. In a current comparator connected to two interconnections connected to the source regions of the two memory cells adjacent to each other in the column direction, a current flowing from the source region of one memory cell is compared to that from the source region of the other memory cell in which the ferroelectric film polarizes in a complementary direction, and the information stored in the one memory cell is detected. In this method of controlling a semiconductor device, two pieces of information complementary to each other are written in two memory cells. Upon readout of information from the memory cell, a readout current of one memory cell is used as a reference current to determine the value of a readout current of the other memory cell, thereby allowing detection of information stored in the memory cell. When the memory cell stores two values, generally the intermediate value of the readout current providing information of "0" or "1" is used as a reference current. In the present invention, however, the readout current of the memory cell in which complementary information is stored is used as a reference current, so that the difference between the readout current and the reference current is great, thereby facilitating detection of information.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, embodiments of the present invention will be described below with reference to the drawings.

First Embodiment

Figure 1:
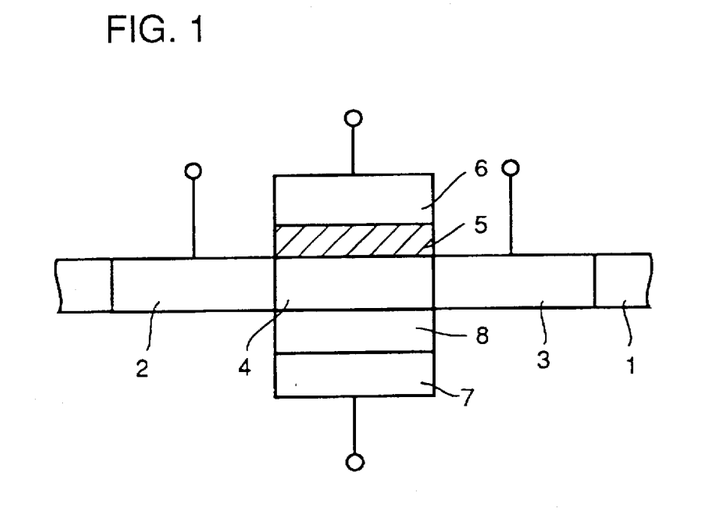
FIG. 1 is a cross sectional view showing a memory cell of a semiconductor device according to a first embodiment of the present invention.

Referring to FIG. 1, in a memory cell of a semiconductor device according to a first embodiment of the present invention, at a prescribed area of a semiconductor region 1 of a memory cell which is formed of a silicon layer and is a p type low concentration impurity region, source/drain regions 2 and 3 which are n type high concentration impurity regions are formed with a prescribed distance therebetween. In semiconductor region 1, a channel formation region 4 is positioned with source/drain regions 2 and 3 on both sides thereof. A gate electrode 6 is formed on channel formation region 4 with a gate dielectric film 5 having a ferroelectric film interposed therebetween. A back gate 7 is formed at a back side position of semiconductor region 1 corresponding to gate electrode 6 formed on semiconductor region 1 with an insulating film 8 interposed therebetween.

The semiconductor device shown in FIG. 1 has ferroelectric material formed of barium titanium oxide (BaTiO$_3$), strontium titanium oxide (SrTiO$_3$) or the like. Such ferroelectric substance has a characteristic that it polarizes once it is placed in an electric field and holds the polarization state due to remanent polarization.

Gate electrode 6 has a length and a width of approximately 5000 Å, and gate dielectric film 5 has a thickness of approximately 300–400 Å. When insulating film 8 is formed of a silicon dioxide layer, it has a thickness of approximately 100 Å. The impurity concentration of the n type impurity included in source/drain regions 2 and 3 is approximately $10^{20}/cm^3$. The thickness of the layer forming the semiconductor region is around 200 Å–3000 Å, and the thickness must be adjusted depending on the semiconductor device designed to be formed.

Figure 2:
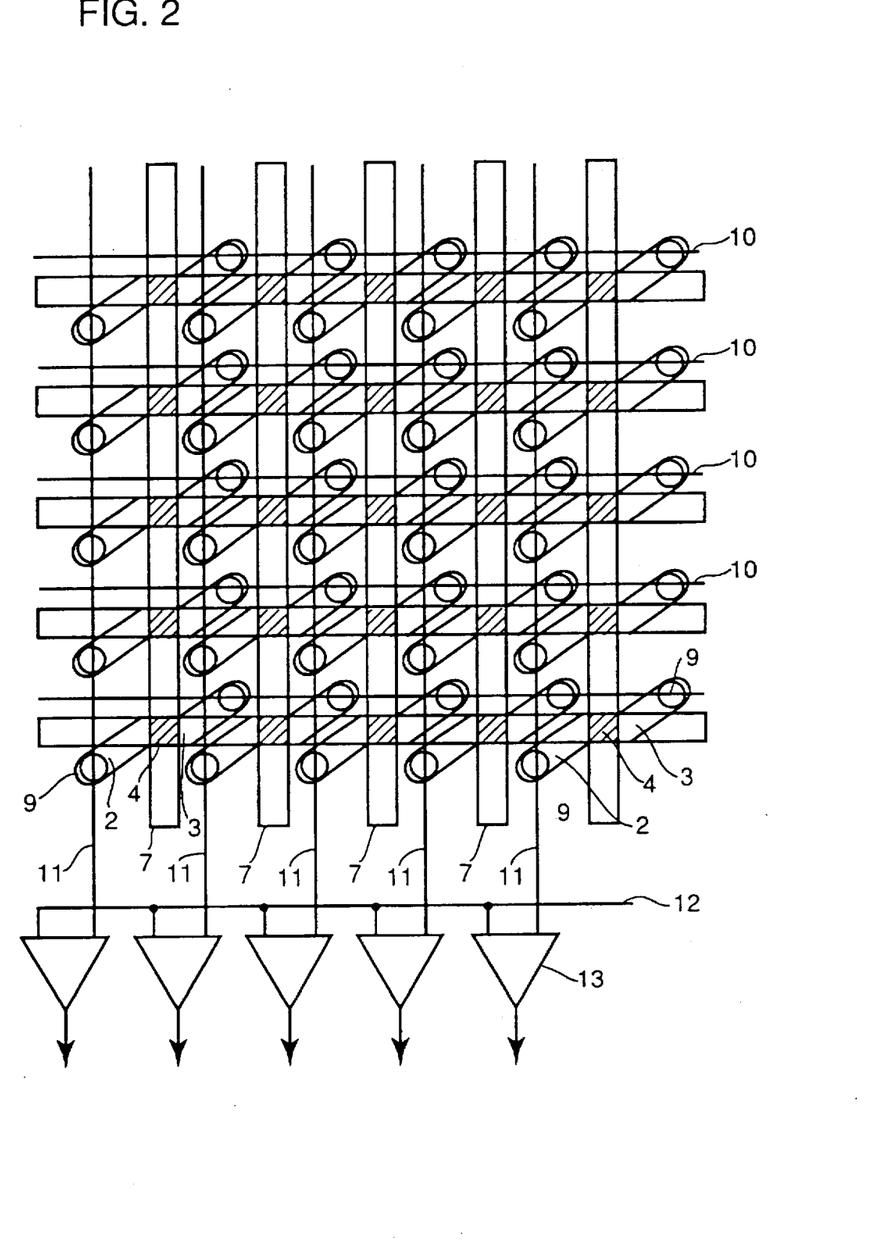
FIG. 2 is a plan view showing the semiconductor device according to the first embodiment of the present invention.

Now, description will be made of a memory cell array in which a plurality of such memory cells are arranged with reference to FIG. 2. Referring to FIG. 2, the memory cells are arranged in a matrix in row and column directions. A connection portion 9 is formed for electrically connecting source/drain regions 2 and 3 and another conductive layer. An interconnection 10 is formed for applying a voltage upon readout of information from a memory cell, while an interconnection 11 is formed for extracting a current upon readout of information from the memory cell. A reference current line 12 necessary when information is read out is provided to connect with a current comparator 13 for comparing a reference current and the current extracted from the memory cell. Regarding the other reference numerals, the identical numerals to those already described show the identical or corresponding portions. This arrangement of the memory cells is characterized in that directions in which conductive layers forming gate electrode 6 and back electrode 7 extend are orthogonal to each other. Each channel formation region 4 is formed at a position where gate electrode 6 and back electrode 7 are overlapped.

Figure 3:
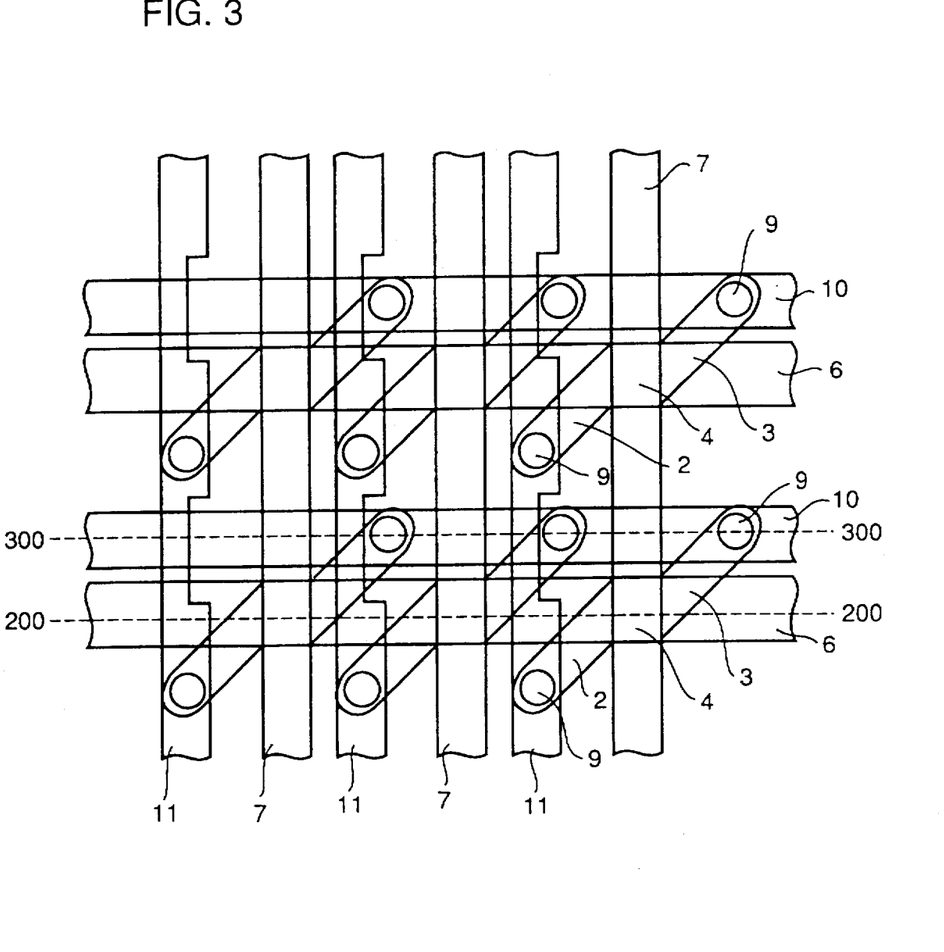
FIG. 3 is a plan view of the memory cells forming a part of the memory cell array shown in FIG. 2.
Figure 4A:
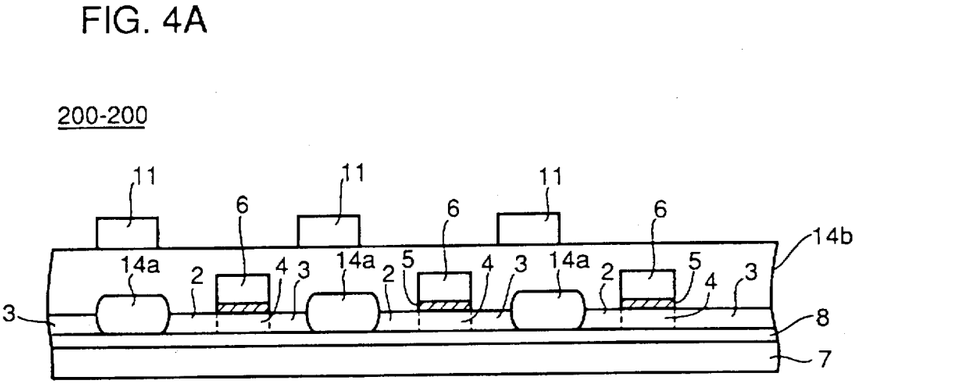
FIGS. 4A and 4B are cross sectional views taken along the lines 200—200 and 300—300 shown in FIG. 3.

FIG. 3 is a plan view showing the memory cells forming a part (2 rows×3 columns) of the memory cell array shown in FIG. 2, and the cross section taken along the line 200—200 in FIG. 3 is shown in FIG. 4A. Referring to FIG. 3 and FIG. 4A, a field oxide film 14a of silicon dioxide is formed for electrically isolating a plurality of memory cells from each other. An insulating film 14b of, for example, silicon dioxide is formed to cover the entire body. Interconnection 10 for applying a voltage upon readout is formed to connect respective drain regions 3 of the memory cells arranged in the row direction. The cross section taken along the line 300—300 shown in FIG. 3 is shown in FIG. 4B.

Figure 4B:
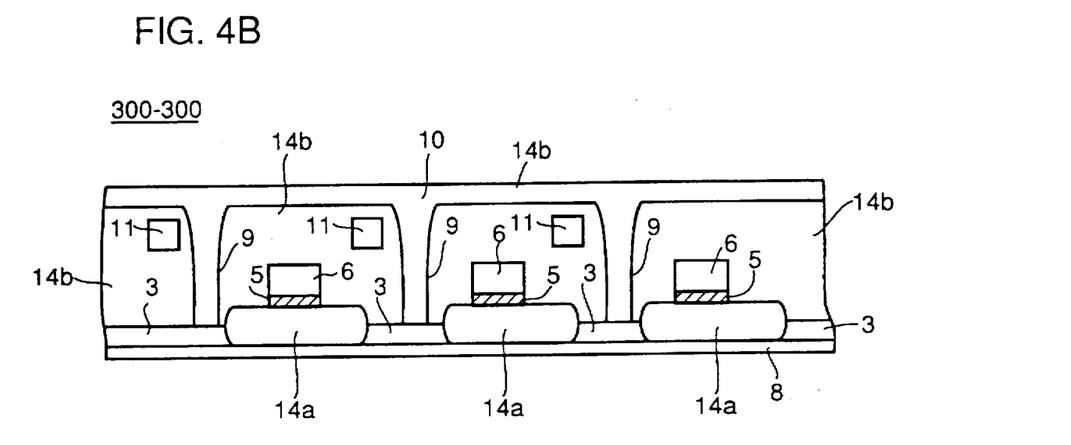

Referring to FIGS. 4A and 4B, gate electrode 6 is formed over channel formation region 4 and back electrode 7 is formed thereunder. Source/drain regions 2 and 3 of the memory cell transistor is formed near the positions where the two electrodes overlap with each other. Interconnection 10 for connecting drain regions 3 of the memory cells arranged in the row direction is disposed to extent in the row direction of the memory cells, while interconnection 11 is disposed to connect source regions 2 of the memory cells arranged in the column direction. These two interconnections 10 and 11 cross each other at an approximately right angle, if seen two-dimensionally.

Next, operations of writing information in the semiconductor device above will be described with reference to FIG. 5.

Figure 5A:
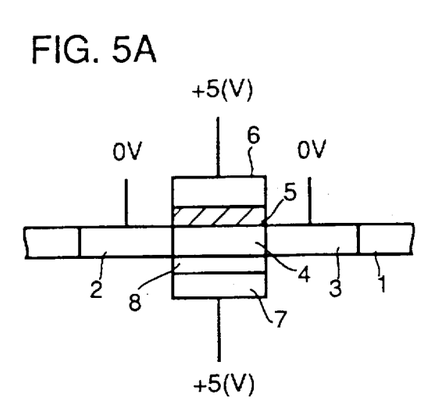
FIGS. 5A and 5B are schematic views for use in illustration of a method of controlling a semiconductor device according to the first embodiment of the present invention.

To write "1", a voltage of about 5 V is applied to back electrode 7 as shown in FIG. 5A. As a result, a channel (inversion layer) is formed at channel formation region 4 in semiconductor region 1. Here, the channel is formed at the entire channel formation region 4 if the silicon layer of semiconductor region 1 is as thin as 200–300 Å, while the channel is formed at a surface of a silicon layer close to back electrode 7 if the silicon layer of region 1 is relatively thick as 2000–3000 Å. In this case, the region other than the surface of the silicon layer is completely depleted. A thin silicon layer of semiconductor region 1 is advantageous for high speed operation, while a thick silicon layer is advantageous to bring about more freedom in the manufacturing steps.

After the channel is thus formed, a voltage of 0 V is applied to interconnections 10 and 11, thereby fixing the potentials of source/drain regions 2 and 3 to 0 V. By thus fixing the potentials of the source/drain regions, the potential of the channel is set equal (0 V) to that of source/drain regions 2 and 3 at the same time. Although the potential of the channel is set to 0 V here, it can be adjusted by adjusting the voltage applied to source/drain regions 2 and 3. Next, a voltage of approximately 5 V is applied to gate electrode 6, so that the ferroelectric film in gate dielectric film 5 can be polarized in a constant direction by the difference in potential between the channel and gate electrode 6. As described above, the ferroelectric film remains almost permanently in the polarization state attained at this point due to remanent polarization until rewrite operation is performed.

Figure 5B:
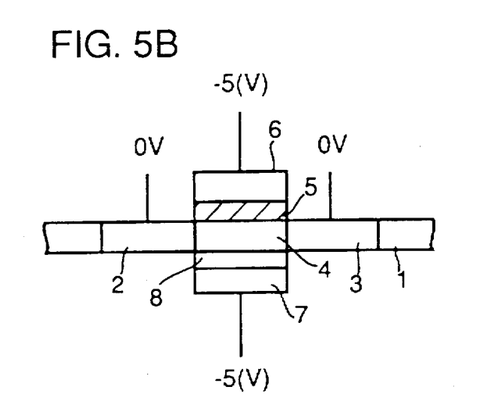

To write "0", a voltage of about 5 V is applied to back electrode 7 to form a channel (inversion layer) at channel formation region 4 as shown in FIG. 5B, similarly to the operation for writing "1". By setting the potentials of source/drain regions 2 and 3 to 0 V, the potential of the channel is set to 0 V. By applying a voltage of −5 V to gate electrode 6, the ferroelectric film in gate dielectric film 5 is polarized in a direction opposite to that in the operation for writing "1". Thus, different information can be held in the memory cell by utilizing the polarizing directions of the ferroelectric film.

Figure 6:
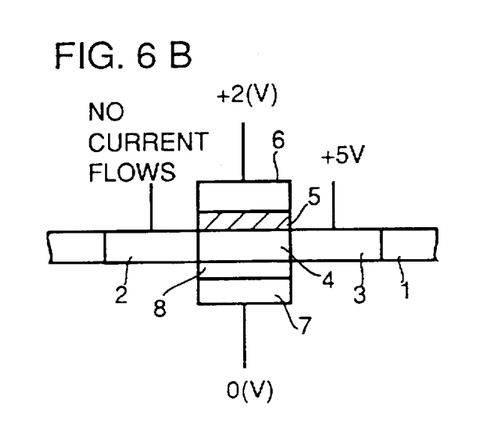
FIGS. 6A and 6B are schematic views for use in illustration of a method of controlling a semiconductor device according to the first embodiment of the present invention.
Figure 6A:
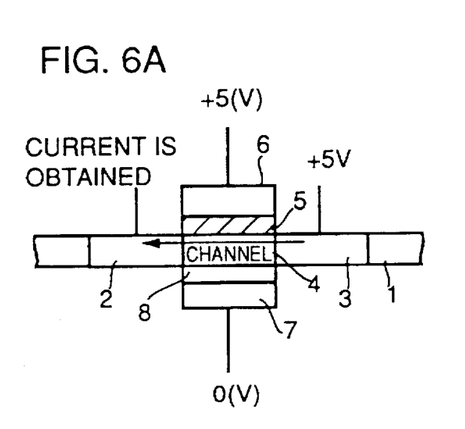

Next, operation for reading out information from the memory cell will be described with reference to FIGS. 6A and 6B. It is assumed that a threshold voltage of the memory cell transistor in a state where gate dielectric film 5 is not polarized is 2 V. If the ferroelectric film polarizes in a negative to positive direction from gate electrode 6 to the channel formation region when a voltage of 2 V is applied to the gate electrode of the memory cell in which information of "1" is stored, the electric field applied to channel formation region 4 is supported. Consequently, the channel of the silicon layer is kept to be formed. Accordingly, if the electric field is applied between source/drain regions 2 and 3 at this point in time, a current (readout current) flows. Data can be read out by detecting this current to detect the difference between the value of this current and the value of reference current (FIG. 6A). The polarizing direction in the ferroelectric film does not change by performing a information read out operation information, and hence, information is not destroyed. Accordingly, refresh operations are not required and the same information can be read out as many times as desired.

If a voltage of 2 V is similarly applied to gate electrode 6 of the memory cell in which information of "0" is stored, the polarizing direction of the ferroelectric film is opposite to that of the electric field directed from gate electrode 6 to channel formation region 4, so that the strength of the electric field applied to channel formation region 4 is weakened. Consequently, formation of the channel is suppressed. If the channel is not formed, no current flows when the electric field is applied between source/drain regions 2 and 3 (FIG. 6B). Even with application of the same voltage to gate electrode 6, the current flows or does not flow between source/drain regions 2 and 3 depending on the polarizing direction of the ferroelectric film. By utilizing such phenomena, information held in the memory cell can be detected.

Among a column of memory cells in each of which a channel is formed by applying a voltage to back electrode 7 in write operation and a row of memory cells in each of which a potential for writing information is applied to gate electrode 6, only the memory cell shared by the column and the row can be selectively written, thereby preventing storage of wrong information to other memory cells.

Although the memory transistor described above is an n channel transistor in the first embodiment, a p channel transistor can also be employed to carry out the similar operations by, for example, applying a positive voltage when a negative voltage is applied in the case described above or applying a negative voltage when a positive voltage is applied in the case above.

Second Embodiment

Now, a second embodiment of the present invention will be described. The difference between the first embodiment described above and the second embodiment lies in that the information held in a memory cell is two values of either "H (1)" or "L (0)" in the first embodiment while multi-value information of more than three values is held in the second embodiment.

The structure of a memory cell holding the multi-value information is exactly the same as that in the first embodiment, and the difference lies in the method of controlling read/write of information.

In writing information, when information of "H" is to be stored, a voltage of approximately 5 V is applied to back electrode 7 to form a channel (inversion layer) at channel formation region 4, as shown in FIG. 5A. A prescribed voltage, for example 0 V, is applied to source/drain regions 2 and 3 and the potential of the channel is also fixed at 0 V. By applying a voltage of approximately 5 V to gate electrode 6, the ferroelectric film in gate dielectric film 5 is polarized in a direction supporting the electric field directed from gate electrode 6 to channel formation region 4, and information of "H" is stored in the memory cell (this writing method is exactly the same as the method for storing "1" in the first embodiment).

It is assumed that information of a value between "H" and "L" and relatively closer to "H" than the average value of "H" and "L" is "Intermediate H". The method of storing such information begins with applying a voltage of approximately 5 V to back electrode 7 to form a channel at channel formation region 4.

By applying a voltage of approximately 0 V to source/drain regions 2 and 3, the potential of the channel is set at 0 V. By applying a voltage of at least 0 V and less than 5 V to gate electrode 6, the ferroelectric film in gate dielectric film 5 is polarized by the difference in potential between gate electrode 6 and the channel. Although the polarizing direction here is the same as the case where "H" is stored, the electric field directed from gate electrode 6 to the channel is not supported as much as the case where "H" is to be stored because the polarization strength is smaller in the case where "Intermediate H" is to be stored.

In order to store information of "L", a voltage of approximately 5 V is applied to back electrode 7 to form a channel at channel formation region 4. A prescribed voltage, for example 0 V, is applied to source/drain regions 2 and 3 to fix the potential of the channel to 0 V. By applying a voltage of approximately −5 V to gate electrode 6, the ferroelectric film in gate dielectric film 5 is polarized in a direction weakening the electric field directed from gate electrode 6 to channel formation region 4. Accordingly, information of "L" is stored in the memory cell (this writing method is exactly the same as storage of "0" in the first embodiment).

It is assumed that information of a value between "H" and "L" and relatively closer to "L" than the average value of "H" and "L" is "Intermediate L". In the method of storing such information, first a voltage of approximately 5 V is applied to back electrode 7 to form a channel at channel formation region 4. A voltage of about 0 V is applied to source/drain regions 2 and 3 and set a potential of the channel at 0 V. By applying a voltage greater than −5 V and smaller than 0 V is applied to gate electrode 6, the ferroelectric film in gate dielectric film 5 is polarized by the difference in potential between gate electrode 6 and the channel. Although the polarizing direction here is the same as the direction to store "L", the electric field directed from gate electrode 6 to the channel is not weakened as much as the case where "L" is to be stored because the strength of polarization is smaller for storing "Intermediate L".

By thus adjusting the strength and direction of polarization in the ferroelectric film, multi-value information of three values or more can be stored.

Next, a method of reading out the multi-value information will be described below.

Figure 7:
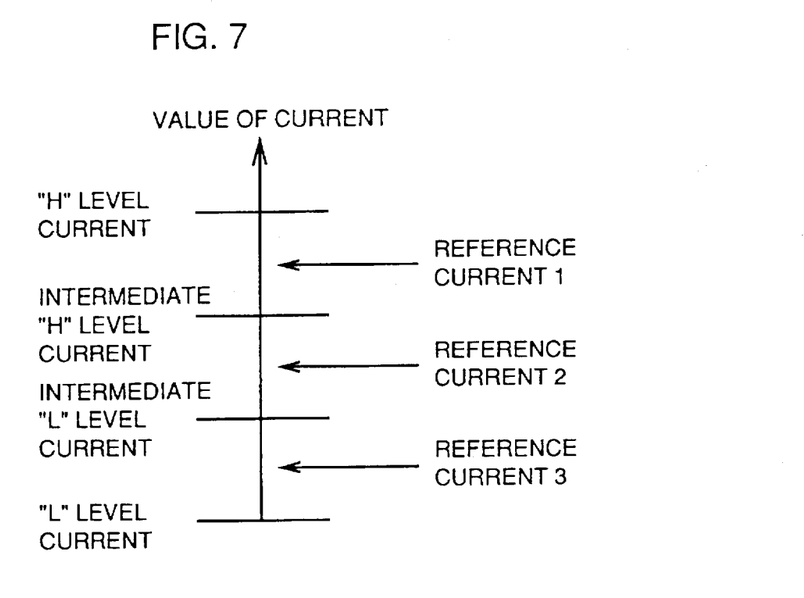
FIG. 7 shows the concept of the second embodiment of the present invention.

If one of the four values ("H", "Intermediate H", "Intermediate L", and "L") is to be taken, such information can be expressed with data of 2 bits: "H" as "1, 1", "Intermediate H" as "1, 0", "Intermediate L" as "0, 1", and "L" as "0, 0". When one memory cell is to be read out to obtain such information, a readout current of the memory cell must be compared with a plurality of reference currents each having a different value. Referring to FIG. 7, if the readout currents of a memory cell are classified into four levels (the currents of a value corresponding to "H", "Intermediate H", "Intermediate L", and "L" respectively), the reference currents are established to have a value between readout currents of "H" and "Intermediate H" (reference current 1), a value between readout currents of "Intermediate H" and "Intermediate L" (reference current 2), and a value between readout currents of "Intermediate L" and "L" (reference current 3). Each reference current and the readout current of the memory cell is successively compared to determine which current is greater in value.

Figure 8:
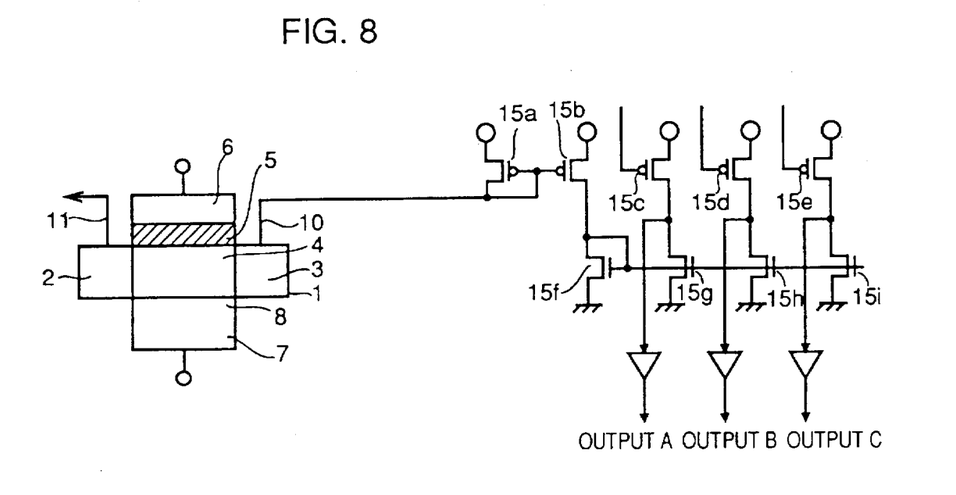
FIG. 8 is a schematic diagram for use in illustration of the structure of the second embodiment of the present invention.

FIG. 8 shows the concept of comparison between the readout current and the reference currents. Referring to FIG. 8, this comparison circuit includes p channel transistors 15a–15e and n channel transistors 15f–15j. A voltage producing reference current 1 is provided to the gate electrode of p channel transistor 15c, and reference current 1 is formed when this transistor renders conductive. Similarly, reference currents 2 and 3 are produced by p channel transistors 15d and 15e, respectively.

Figure 9:
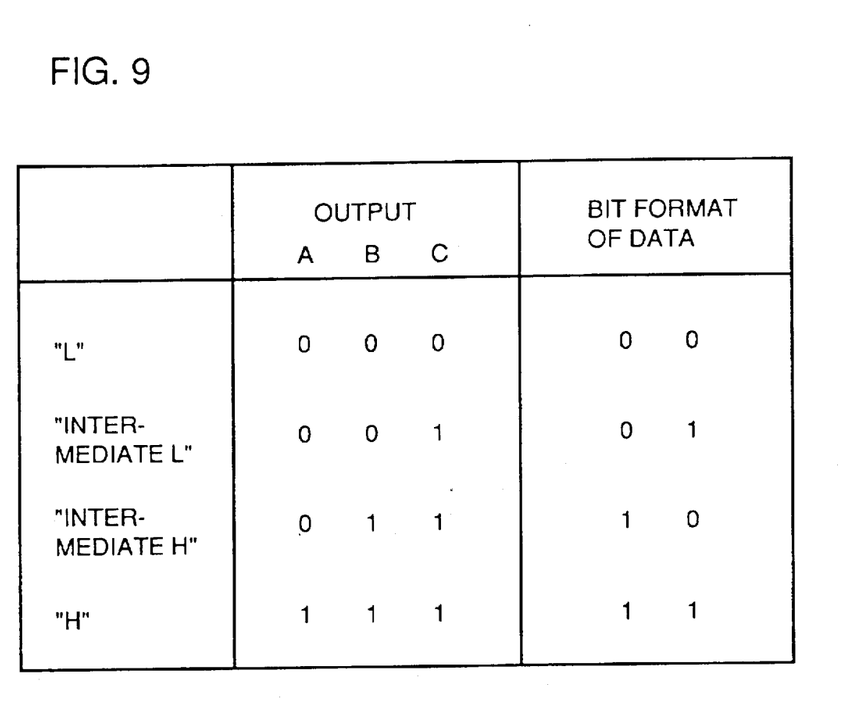
FIG. 9 shows a concept illustrating operations of the second embodiment of the present invention.

As shown in this example, information which is output after such comparison is of three values if a memory cell can store the four-value information. In this example, the result of comparison between reference current 1 and the readout current of the memory cell is output from an output terminal A as "1" if the value of the readout current of the memory cell is greater than that of reference current 1 or "0" if it is smaller. Similarly, the result of comparison between reference current 2 and the readout current of the memory cell is output from an output terminal B, and the result of comparison between reference current 3 and the readout current of the memory cell is output from an output terminal C. FIG. 9 shows the relationship between information (outputs A, B and C) provided from output terminals A–C and the information stored in the memory cell.

As shown in FIG. 9, if all the outputs A, B and C are "0", the information held in the memory cell is "L" (the information corresponding to "0, 0" expressed with data of 2 bits (the bit format of data)). If outputs A and B are "0" and output C is "1", the information held in the memory cell is "Intermediate L" ("0, 1"). If output A is "0" and outputs B and C are "1", the information held in the memory cell is "Intermediate H" ("1, 0"). If all the outputs A, B and C are "1", the information held in the memory cell is "H" ("1, 1"). By thus comparing the value of the readout current of the memory cell with reference currents, information in the memory cell can be detected.

As described above, although binary information has been generally held and it has been difficult to hold multi-value information in a conventional memory cell, multi-value information can be detected in the present invention by adopting a method in which the reference currents are set at a plurality of levels to be compared successively with the readout current of the memory cell. More information can be stored in a semiconductor device having the same number of memory cells as a conventional one since one memory cell can take more information, thereby effectively increasing the capacity.

Third Embodiment

Now, a third embodiment of the present invention will be described. In the first and second embodiments described above, information is held individually in a plurality of memory cells arranged in row and column directions, and in order to read out information in the memory cell the readout current of a predetermined one of the memory cells and the reference current are compared at current comparator (sense amplifier) 13 to detect information. In the third embodiment, two memory cells (a memory cell MC and a complementary memory cell /MC) are employed to store one piece of information. Specifically, pieces of information complementary to each other are stored in these two memory cells and the readout current of complementary memory cells /MC is used as the reference current for use in reading out information.

Figure 10:
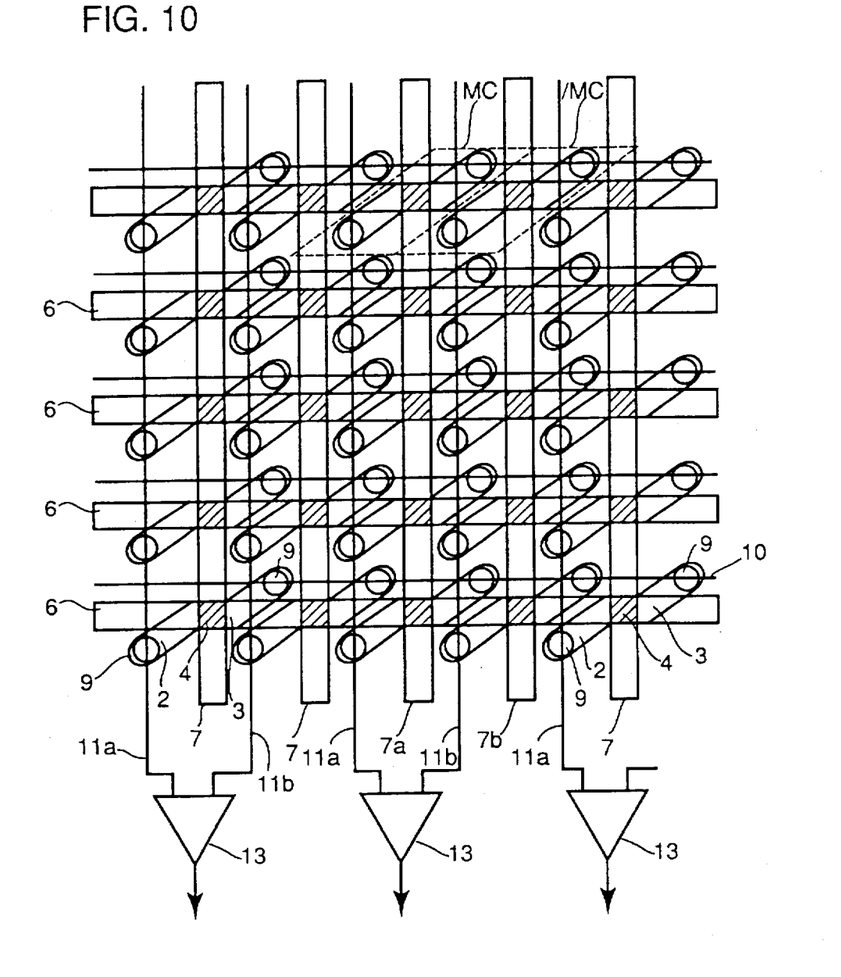
FIG. 10 is a plan view showing a semiconductor device according to a third embodiment of the present invention.

FIG. 10 shows a concept of an important part of a semiconductor device employing this complementary memory cell /MC. Referring to FIG. 10, an interconnection 11a is formed to connect source regions 2 of memory cells MC in odd columns among the memory cells arranged in a matrix. An interconnection 11b is formed to connect through a contact source regions 2 of complementary memory cells /MC in even columns. The other reference numerals indicate the same or corresponding portion as the numerals mentioned above. Current comparators 13 are arranged in the row direction of the memory cells, each compares currents supplied from interconnection 11a connected to the source regions of memory cells MC and from interconnection 11b connected to source regions 2 of complementary memory cells /MC.

Next, description will be made of writing information in the semiconductor device of the third embodiment. To write "1", a voltage of approximately 5 V is applied to back electrodes 7a and 7b as shown in FIG. 10. As a result, a channel (inversion layer) is formed at each channel formation region 4 of memory cell MC and complementary memory cells /MC. Thereafter, a voltage of 0 V is applied to interconnections 11a and 11b and interconnection 10 connected to drain regions 3. By thus setting the potentials of source/drain regions 2 and 3 of memory cell MC and complementary memory cell /MC at 0 V, the potential of each channel of these memory cells is set at 0 V. A voltage of approximately 5 V is then applied to gate electrode 6a of memory cell MC, and the ferroelectric film in gate dielectric film 5 is polarized in a constant direction by the difference in potential between gate electrode 6a and the channel. At the same time or at a different timing, a voltage of approximately −5 V is applied to gate electrode 6a of complementary memory cell /MC. By utilizing the difference in potential between gate electrode 6a and the channel, the ferroelectric film in gate dielectric film 5 is polarized in a direction opposite to that of the ferroelectric film of memory cell MC. As a result, information can be written in the memory cells.

To write "0", the operations up to formation of a channel at each channel formation region 4 of memory cell MC and complementary cell /MC are performed similarly to those for writing "1". After the channel is formed, a voltage of 0 V is supplied to source/drain regions 2 and 3, thereby setting the potential of the channel to 0 V. By applying a voltage of −5 V to gate electrode 6a of the memory cell MC, and the ferroelectric film in gate dielectric film 5 is polarized in a constant direction (polarized in the direction opposite to that for storing "1") by the difference in potential between gate electrode 6a and the channel. At the same time or at a different timing, a voltage of approximately 5 V is applied to gate electrode 6a of complementary memory cell /MC, and by utilizing the difference in potential between gate electrode 6a and the channel, the ferroelectric film in gate dielectric film 5 is polarized in a direction opposite to the polarization direction of the ferroelectric film of memory cell MC (polarized in a direction opposite to that for storing "1"). Consequently, information can be written in the memory cells.

Next, readout of information from memory cell MC will be described.

It is assumed that a threshold voltage of each memory cell transistor in memory cell MC and complementary memory cell /MC is 2 V in a state where gate dielectric film 5 is not polarized. When a voltage of 2 V is applied to gate electrode 6a of memory cell MC in which information of "1" is stored and the ferroelectric film is polarized in a negative to positive direction directed from gate electrode 6a to channel formation region 4, the dielectric film increases the strength of the electric field applied to the channel from gate electrode 6a. As a result, the channel is kept in the silicon layer. Therefore, current flows if the electric field is applied between source/drain regions 2 and 3 at this point in time. Similarly, the same voltage as that applied to gate electrode 6 of memory cell MC is applied to complementary memory cell /MC. Since complementary memory cell /MC holds information opposite to that of memory cell MC, the electric field directed from gate electrode 6a to the channel is partially weakened, so that the channel is not formed. Therefore, no current flows even though the electric field is applied between source/drain regions 2 and 3. The readout current described above flows over interconnections 11a and 11b connected to source regions 2 of memory cell MC and complementary memory cell /MC, and the values of currents are compared by current comparator 13. In this case, the readout current of complementary memory cell /MC is 0 ampere, while the readout current of memory cell MC is several amperes. Thus, the readout current of memory cell MC is greater than that of complementary memory cell /MC, so that information held in the memory cell can be detected as "1".

When "0" is stored in the memory cell, a voltage is similarly applied to gate electrode 6a and the electric field is applied between source/drain regions 2 and 3. In this case, gate dielectric film 5 in the memory cell is polarized in a direction weakening the electric field applied between gate electrode 6a and the channel, so that the channel is not formed and no current flows over interconnection 11a. Meanwhile, the dielectric film 5 in complementary memory cell /MC is polarized in a direction supporting the electric field applied between gate electrode 6a and the channel, so that the channel is kept to be formed and a current of several amperes flows over interconnection 11b. The values of currents flowing over interconnections 11a and 11b are compared by current comparator 13. If the readout current of memory cell MC is determined to be smaller in value than that of complementary memory cell /MC, the information held in memory cell MC can be detected as "0".

As illustrated in this example, two pieces of information complementary to each other are stored in two memory cells and therefore a greater difference is generated between the values of currents when they are compared by current comparator 13. As a result, detection of information can be performed accurately. If there is no difference between the two values of currents, destruction of information in the memory cell or the complementary memory cell can be found. If information is held for an extremely long period of time, the remanent polarization of the ferroelectric film is reduced, thereby making smaller the difference in value of the readout currents of the two memory cells. In such a case, information in the memory cell can be retained by refresh operations.

Fourth Embodiment

Figure 11:
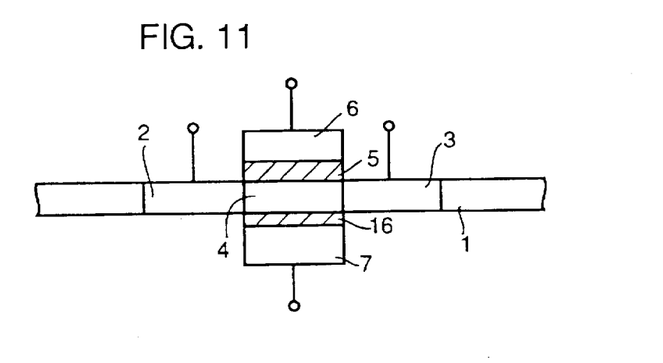
FIG. 11 is a cross sectional view showing a semiconductor device according to a fourth embodiment of the present invention.

The structure of a memory cell shown in FIG. 11 can be conceived as a fourth embodiment of the present invention. The structure in accordance with the fourth embodiment is characterized in that a ferroelectric film 16 is also formed between back gate electrode 7 and semiconductor region 1.

Write operations of the semiconductor device employing such a memory cell will be described below. In order to write information of either "0" or "1", a channel must be formed at channel formation region 4 of semiconductor region 1. In forming the channel, the electric field is applied to channel formation region 4 from back electrode 7. Here, by polarizing in advance the ferroelectric film 16 closer to back electrode 7 in a direction supporting the electric field for forming the channel, the channel (inversion layer) can be formed more efficiently when information is to be written in the memory cell.

If ferroelectric film 16 is polarized in a direction suppressing formation of the channel, the channel is not formed even if a minimum voltage required for formation of the channel is applied to back electrode 7, thereby establishing a state where rewriting to the memory cell in which information is already stored is inhibited. Reading/writing from/to the memory cell can be performed by utilizing the same method as that described in the first embodiment.

Fifth Embodiment

Figure 12:
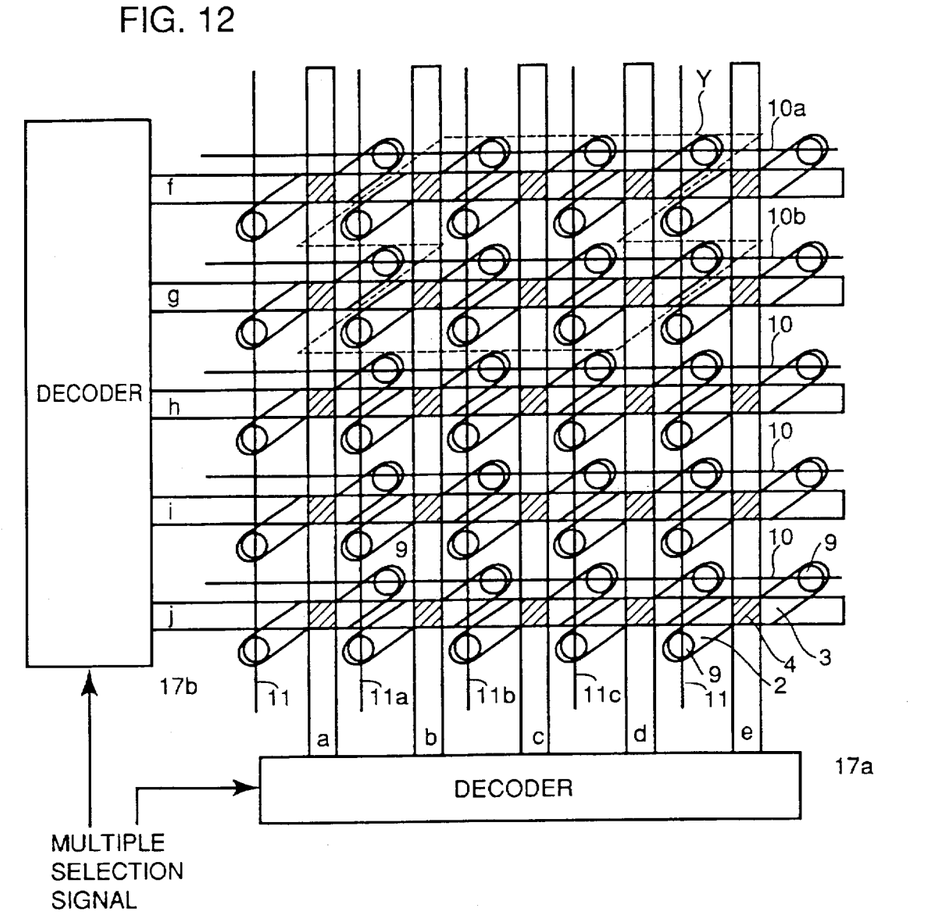
FIG. 12 is a plan view showing a semiconductor device according to a fifth embodiment of the present invention.

Now, a fifth embodiment of the present invention will be described with reference to FIG. 12. Electrode lines f, g, h, i and j, serving as the gate electrodes of the memory cells arranged in a row direction among the memory cells arranged in row and column directions, are formed with a prescribed distance therebetween. Electrode lines f–j connect the drain regions of the memory cells arranged in the row direction. Electrode lines a, b, c, d and e serving as back electrodes 7 of the memory cells are formed substantially orthogonal to electrode lines f–j. Electrode lines a–e connect source regions 2 of the memory cells arranged in the column direction. Electrode lines a–e serving as the back electrodes and electrode lines f–j serving as the gate electrodes are connected to decoder circuits 17a and 17b, respectively. An arbitrary electrode line is selected among a plurality of electrode lines at decoder circuits 17a and 17b, and a prescribed voltage is applied to the selected electrode line.

Usually, when information is to be written in one memory cell, one of electrode lines a–e and one of electrode lines f–j are selected and information can be written in a position where these electrode lines overlap with each other. In this embodiment, a plurality of memory cells can be erased and rewritten at a time by selecting a plurality of electrode lines at the same time, operations of which will be described below.

Consider an example where information in a memory cell group Y of 2 rows×3 columns is rewritten simultaneously. A multiple selection signal is input to decoder circuit 17a, through which electrode lines b, c and d are selected, and a voltage of 5 V is applied to these electrode lines b, c and d. A channel (inversion layer) is formed at channel formation region 4 formed by the silicon layer of the memory cell. A voltage of 0 V is applied to interconnections 10a, 10b, 11a, 11b, and 11c connected to source/drain regions 2 and 3, thereby setting the potential of the channel at 0 V. A multiple selection signal is applied to decoder circuit 17b, through which electrode lines f and g are selected. A voltage of 5 V is applied to gate electrode 6 to write information of "1" to the memory cells, while a voltage of −5 V is applied thereto to write information of "0". By such application of the voltage to gate electrode 6, the difference in potential is generated between the channel and the gate electrode 6, thereby polarizing the ferroelectric film in gate dielectric film 5. Consequently, information in memory cell group Y is erased and rewritten.

By selecting all the back electrodes 7 and gate electrodes 6 by decoder circuits 17a and 17b and polarizing the ferroelectric film with use of a difference in potential between the channel and gate electrode 6, the data in all the memory cells can be erased entirely.

Sixth Embodiment

Figure 13:
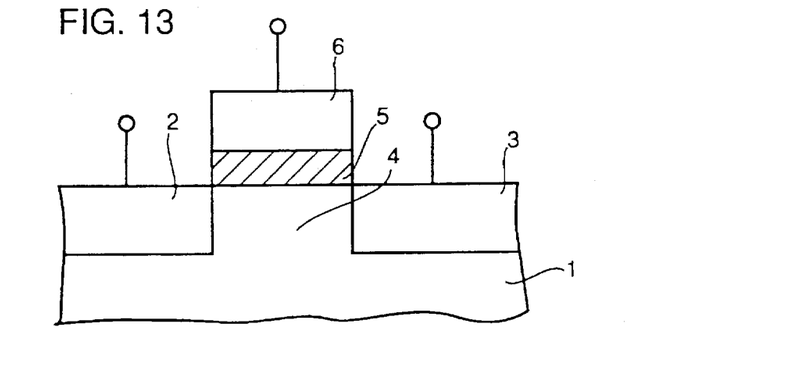
FIG. 13 is a cross sectional view showing a semiconductor device according to a sixth embodiment of the present invention.

Now, a sixth embodiment of the present invention will be described with reference to FIG. 13. FIG. 13 shows a cross section in the direction of the gate length of one memory cell. Referring to FIG. 13, in the sixth embodiment, source/drain regions 2 and 3 are formed with a prescribed difference therebetween on both sides of channel formation region 4 at a main surface of a semiconductor substrate 1 including p type impurity (or a semiconductor region which is a p type low impurity concentration region of a TFT (Thin Film Transistor)). On channel formation region 4, gate electrode 6 is formed with gate dielectric film 5 having a ferroelectric film interposed therebetween.

In the structured memory cell of the sixth embodiment, electrode lines serving as gate electrodes 6 arranged in a matrix in row and column directions are connected to decoder circuit 17b similarly to the first through fifth embodiments. Interconnection 10 for applying a voltage upon readout and connecting drain regions 3 of the memory cells arranged in the row directions, and interconnection 11 for extracting current upon readout and connecting source regions 2 of the memory cells arranged in the column direction are disposed. Interconnection 11 connecting source regions 2 is connected to current comparator (sense amplifier) 13.

Now, a method of writing information by employing the memory cell shown in FIG. 13 will be described. To write "1", a voltage of approximately 5 V is applied to gate electrode 6 and form a channel (inversion layer) at channel formation region 4. By applying a voltage of about 0 V to source/drain regions 2 and 3, the potential of the channel is set at 0 V. The ferroelectric film in gate dielectric film 5 positioned between gate electrode 6 and the channel is polarized by the difference in potential. Here, the film polarizes in a direction supporting the electric field directed from gate electrode 6 to the channel. As a result, "1" can be written.

To write "0", a voltage close to a threshold voltage of the memory cell transistor in a state where gate dielectric film 5 is not polarized in a particular direction is applied to gate electrode 6, thereby forming a channel at channel formation region 4. A voltage greater by 5 V than that applied to gate electrode 6 is applied to source/drain regions 2 and 3, thereby setting the potential of the channel equal to that of source/drain regions 2 and 3. By the difference in potential between gate electrode 6 and the channel, the ferroelectric film in gate dielectric film 5 is polarized. Here, it is polarized in a direction reducing the strength of the electric field directed from gate electrode 6 to the channel, and "0" is thus written.

Next, readout of information stored in the memory cell will be described.

A voltage having such a value as to form a channel is applied to a word line (electrode. line) connected to gate electrode 6 of the memory cell to be read out, and the electric field is applied between source/drain regions 2 and 3. If "1" is stored in the memory cell, the ferroelectric film is polarized in a direction supporting the electric field directed from gate electrode 6 to the channel, so that a state in which a channel is formed is retained and the readout current of the memory cell flows from source region 2. This current is compared with the reference current by current comparator (not shown) to determine that the readout current is greater than the reference current, thereby outputting information "1".

If "0" is stored in the memory cell, formation of a channel at channel formation region 4 is prevented even though a voltage around the threshold voltage is applied to gate electrode 6, because the ferroelectric film is polarized so as to weaken the electric field directed from gate electrode 6 to the channel, as described above. As a result, no current flows even if the electric field is applied between source/drain regions 2 and 3, and the current flowing to source region 2 is 0 ampere. This current is compared with reference current by the current comparator to detect the readout current is smaller in value than the reference current, thereby outputting information "0".

Similarly to the description made in the second embodiment, multi-value information can be stored by adjusting the direction and strength of polarization of the ferroelectric film in the memory cell. A voltage around a threshold voltage of the memory cell transistor is applied to gate electrode 6 to form a channel similarly to the usual writing operations, and then a voltage applied to source/drain regions 2 and 3 is adjusted. Consequently, the strength of the electric field applied between gate electrode 6 and the channel can be made at several levels. Readout of multi-value information can be performed exactly the same as the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device with a memory cell, said memory cell comprising:

a first semiconductor region of a first conductivity type forming a channel region;

second semiconductor regions of a second conductivity type forming a pair of source/drain regions formed at both ends of said first semiconductor region;

a gate dielectric film formed on one main surface of said first semiconductor region and having a ferroelectric film;

a gate electrode formed on said ferroelectric film; and a back electrode formed on another main surface of said first semiconductor region at a position corresponding to said gate electrode with an insulating film interposed therebetween.

2. The semiconductor device according to claim 1, wherein the insulating film interposed between said back electrode and said another main surface of said first semiconductor region includes a ferroelectric film.

3. The semiconductor device according to claim 1, wherein said gate electrode and said back electrode are each formed in a strip, and said gate electrode and said back electrode are disposed to extend in directions different from each other.

4. The semiconductor device according to claim 1, wherein said gate electrode and said back electrode are each formed in a strip and disposed to extend in directions different from each other, and a source region and a drain region formed at one memory cell are disposed to extend in directions different from the directions in which said gate electrode and said back electrode extend.

5. The semiconductor device according to claim 1, wherein said gate electrode and said back electrode are each formed in a strip and disposed to extend in directions different from each other, and an angle formed by the directions in which said gate electrode and said back electrode of a memory cell extend is substantially a right angle at a position where said gate electrode and said back electrode are overlapped with each other.

6. A semiconductor device comprising:

a plurality of memory cells arranged in row and column directions each including:

a first semiconductor region of a first conductivity type forming a channel region;

second semiconductor regions of a second conductivity type forming a pair of source/drain regions formed at both ends of said first semiconductor region;

a gate dielectric film formed on one main surface of said first semiconductor region and having a ferroelectric film;

a gate electrode formed on said ferroelectric film; and a back electrode formed on another main surface of said first semiconductor region at a position corresponding to said gate electrode with an insulating film interposed therebetween.

7. A method of controlling a semiconductor device, comprising the steps of:

forming an inversion layer, at a first semiconductor region of a first conductivity type constituting a channel region which has one main surface and another main surface, by applying a prescribed voltage to a back electrode formed under said another main surface of said first semiconductor region with an insulating film interposed therebetween;

applying a prescribed voltage to second semiconductor regions of second conductivity type constituting source/drain regions formed in contact with both ends of said first semiconductor region, and setting a potential of the inversion layer equal to that of the source/drain regions; and applying a voltage of an arbitrary value to a gate electrode formed on said one main surface of said first semiconductor region with a gate dielectric film having a ferroelectric film interposed therebetween, and polarizing the ferroelectric film in the gate dielectric film by a difference in potential between the gate electrode and the inversion layer.

8. The method of controlling a semiconductor device according to claim 7, wherein in the step of polarizing said ferroelectric film, said ferroelectric film attain a plurality of polarization states.

9. The method of controlling a semiconductor device according to claim 7, wherein said first semiconductor region includes p type impurity, said source/drain regions include n type impurity, a positive voltage is applied to said back electrode in the step of forming said inversion layer, and either positive or negative voltage is applied to said gate electrode in the step of polarizing said ferroelectric film.

10. The method of controlling a semiconductor device according to claim 7, wherein said first semiconductor region includes n type impurity, said source/drain regions include a p type impurity, a negative voltage is applied to said back electrode in the step of forming said inversion layer, and either negative or positive voltage is applied to said gate electrode in the step of polarizing said ferroelectric film.

* * * * *